United States Patent
Teng et al.

(10) Patent No.: US 8,175,824 B2
(45) Date of Patent: May 8, 2012

(54) CIRCUIT TESTING APPARATUS

(75) Inventors: Cheng-Yung Teng, Taipei County (TW); Li-Jieu Hsu, Taipei (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 324 days.

(21) Appl. No.: 12/467,740

(22) Filed: May 18, 2009

(65) Prior Publication Data
US 2009/0326844 A1 Dec. 31, 2009

(30) Foreign Application Priority Data

Jun. 25, 2008 (TW) .............................. 97211259 U

(51) Int. Cl.
G01R 15/00 (2006.01)
G01R 27/00 (2006.01)
G01R 31/00 (2006.01)
G01R 31/12 (2006.01)
G01R 31/312 (2006.01)

(52) U.S. Cl. ............ 702/57; 702/65; 702/117; 324/548; 324/527

(58) Field of Classification Search .................... 702/64, 702/65, 57, 117; 324/548, 765, 523, 519, 324/522, 527, 537, 769, 763, 678, 676, 677, 324/658

See application file for complete search history.

(56) References Cited

U.S. PATENT DOCUMENTS

| 4,686,628 | A | * | 8/1987 | Lee et al. ...................... 702/117 |
| 5,844,412 | A | * | 12/1998 | Norton .......................... 324/548 |
| 6,051,968 | A | * | 4/2000 | Shim et al. ............... 324/756.02 |
| 7,173,438 | B2 | * | 2/2007 | Pooranakaran et al. ...... 324/678 |

* cited by examiner

*Primary Examiner* — Michael Nghiem
*Assistant Examiner* — Ricky Ngon
(74) *Attorney, Agent, or Firm* — Muncy, Geissler, Olds & Lowe, PLLC

(57) ABSTRACT

A circuit testing apparatus for testing capacitance of a capacitor of a device under test is provided. The circuit testing apparatus includes a measuring module, a first converting module, a processing module and a second converting module. The measuring module provides a testing signal, and determines the capacitance of the capacitor according to a signal measuring result of the testing signal. The first converting module is coupled to the measuring module for converting the testing signal to generate a testing input signal. The processing module is coupled to the first converting module and the device under test for transmitting the testing input signal to the capacitor, and amplifies an output signal generated by the capacitor to generate an amplified signal. The second converting module is coupled to the processing module and the measuring module for converting the amplified signal to generate the signal measuring result.

10 Claims, 2 Drawing Sheets

CIRCUIT TESTING APPARATUS

CROSS REFERENCE TO RELATED APPLICATIONS

This Application claims priority of Taiwan Patent Application No. 097211259, filed on Jun. 25, 2008, the entirety of which is incorporated by reference herein.

BACKGROUND OF THE INVENTION

1. Field of the Invention

The invention relates to a testing apparatus, and more particularly to a circuit testing apparatus for testing the capacitance of a capacitor of a device under test.

2. Description of the Related Art

Along with the advancements in integrated circuit (IC) technology, both the functionalities and importance of ICs have increased. Besides basic analog ICs and digital ICs, several kinds of ICs which are capable of processing both analog and digital signals are presented from markets. Such kinds of ICs are generally called mixed signal ICs. Regardless of any type of IC, such as the basic analog ICs, the basic digital ICs, or the mixed signal ICs, each IC will be tested after being manufactured to ensure quality. Additionally, according to the test result, each IC will be determined to have passed or failed the test, and only the ICs that pass the test will be provided to downstream customers.

FIG. 1 illustrates a dedicated testing apparatus for testing capacitance of a capacitor of a device under test. A variety of dedicated testing apparatuses may be used to test the functionalities of the device under test (e.g. an IC). As shown in FIG. 1, if the device under test 12 has a capacitor C, measuring the capacitance of the capacitor C needs the dedicated testing apparatus 10. The dedicated testing apparatus 10 transmits an initial testing signal ST to the device under test 12 for measurement of the capacitance, and then tests two terminals of the capacitor C to acquire the signal in response to the testing signal ST. Accordingly, the capacitance of the capacitor C may be obtained by determining the received signals from the capacitor C.

However, the price of a dedicated testing apparatus 10 is very expensive. Furthermore, besides the dedicated testing apparatus, there are no other generic testing apparatuses with capability of testing capacitance, which is inconvenient to users. Thus, it is required improving a generic digital logical testing apparatus to test the capacitance of a capacitor within a device under test.

BRIEF SUMMARY OF THE INVENTION

One object of the present invention is to provide a circuit testing apparatus, which uses a digital testing machine to measure the capacitance of the capacitor in a device under test, so as to solve the above problems.

A circuit testing apparatus is provided. An embodiment of the circuit testing apparatus comprises a measuring module, a first converting module, a processing module and a second converting module. The measuring module provides a testing signal, and determines the capacitance of the capacitor according to a signal measuring result of the testing signal. The first converting module is coupled to the measuring module for converting the testing signal to generate a testing input signal. The processing module is coupled to the first converting module and the device under test for transmitting the testing input signal to the capacitor, and amplifying an output signal generated by the capacitor to generate an amplified signal. The second converting module is coupled to the processing module and the measuring module for converting the amplified signal to generate the signal measuring result.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
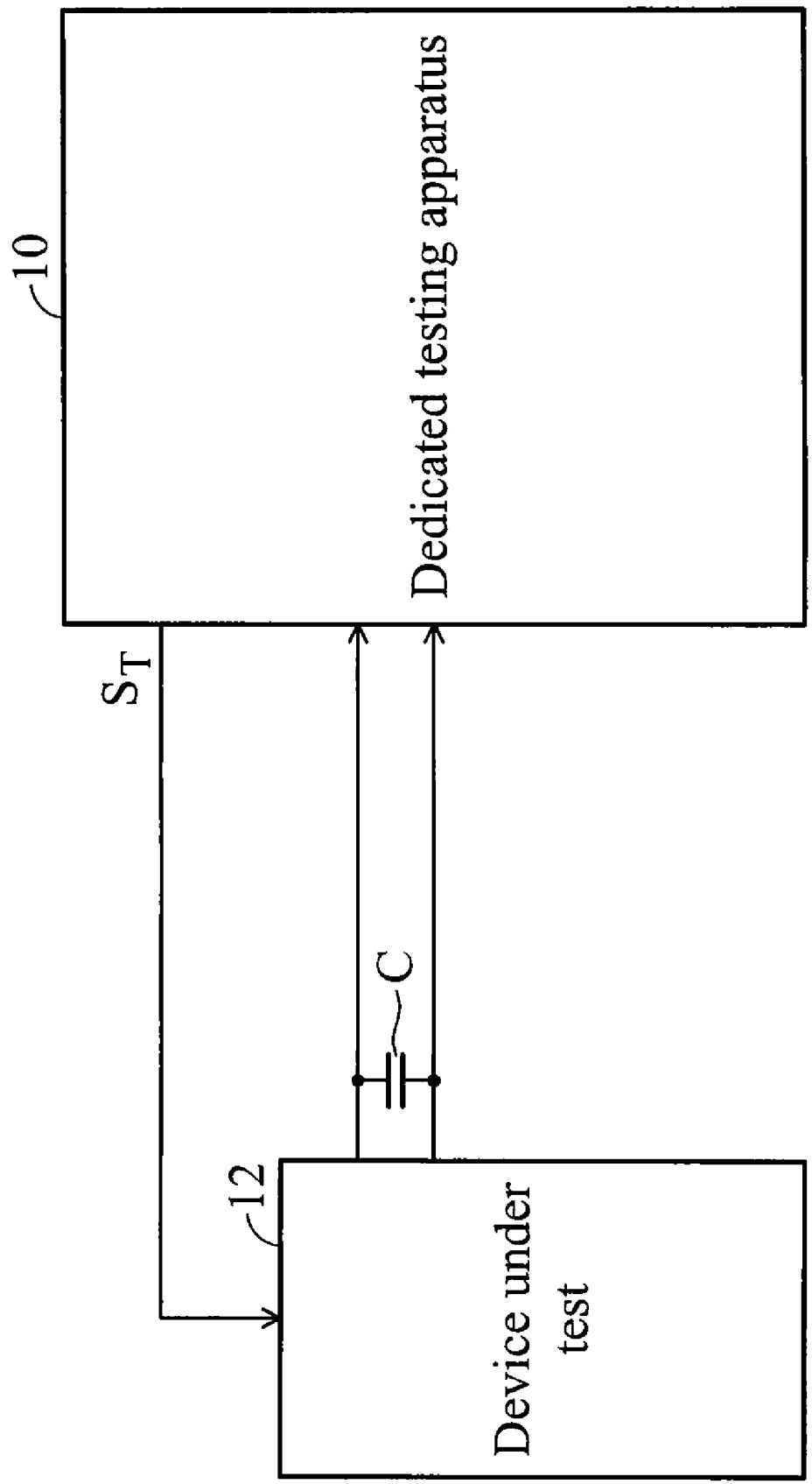
FIG. 1 shows a dedicated testing apparatus for testing capacitance of a capacitor of a device under test.
Figure 2:
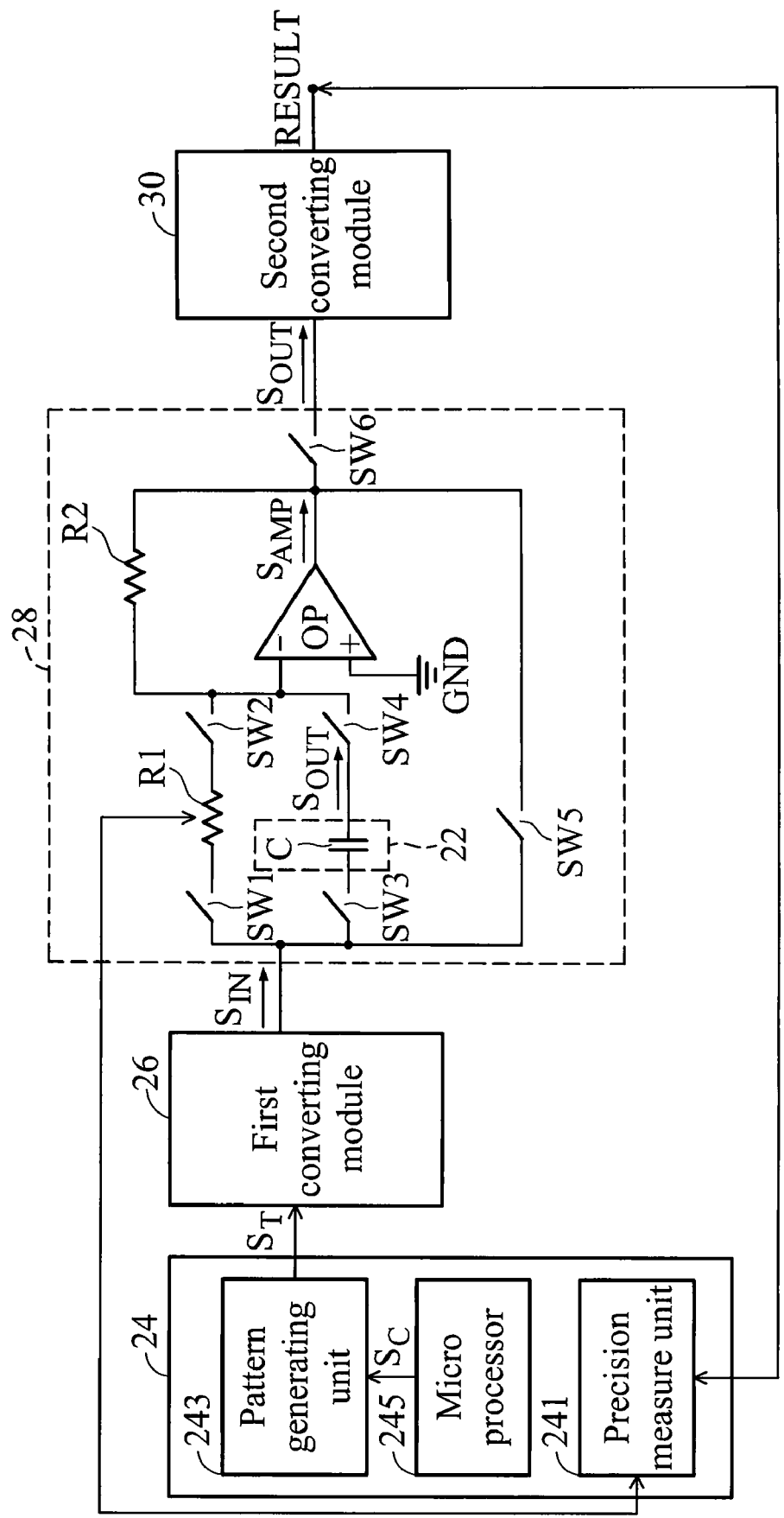
FIG. 2 illustrates a block diagram of a circuit testing apparatus according to an embodiment of the present invention.

FIG. 2 shows a block diagram of a circuit testing apparatus 20 according to an embodiment of the invention. As shown in FIG. 2, the circuit testing apparatus 20 is used for testing a device under test 22. According to an embodiment of the present invention, the device under test 22 includes an Integrated Circuit (IC). The circuit testing apparatus 20 is used to measure the capacitance CV of a capacitor C within the device under test 22. The circuit testing apparatus 20 comprises a measuring module 24, a first converting module 26, a processing module 28 and a second converting module 30. The measuring module 24 provides a testing signal $S_T$, and determines the capacitance CV of the capacitor C according to a signal measuring result RESULT generated by the testing signal $S_T$. The first converting module 26 is coupled to the measuring module 24 for converting the testing signal $S_T$ to generate a testing input signal $S_{IN}$. The processing module 28 is coupled to the first converting module 26 and the device under test 22 for transmitting the testing input signal $S_{IN}$ to the capacitor C, and amplifies an output signal $S_{OUT}$ provided by the capacitor C to generate an amplified signal $S_{AMP}$. The second converting module 30 is coupled to the processing module 28 and the measuring module 24 for converting the amplified signal $S_{AMP}$ to generate the signal measuring result RESULT, wherein the measuring module 24 is disposed in a logic testing machine.

The processing module 28 comprises a first switch SW1, a second switch SW2, a third switch SW3, a fourth switch SW4, a fifth switch SW5, a sixth switch SW6, an amplifier OP, a first resistor R1 and a second resistor R2. One terminal of the first switch SW1 is coupled to the first converting module 26. One terminal of the first resistor R1 is coupled to the first switch SW1, and another terminal of the first resistor R1 is coupled to the second switch SW2. One terminal of the third switch SW3 is coupled to the first converting module 26, and another terminal of the third switch SW3 is coupled to one terminal of the capacitor C. One terminal of the fourth switch SW4 is coupled to another terminal of the capacitor C. The amplifier OP comprises a non-negative input terminal (+), a negative input terminal (−) and an output terminal. The negative input terminal (−) is coupled to another terminal of the second switch SW2 and the another terminal of the fourth switch SW4, and the non-negative input terminal (+) is coupled to a ground GND. The amplifier OP amplifies the output signal $S_{OUT}$ to generate the amplified signal $S_{AMP}$. One terminal of the fifth switch SW5 is coupled to the first converting module 26, and another terminal of the fifth switch SW5 is coupled to the output terminal of the amplifier OP. The second resistor R2 is coupled between the output terminal and the negative input terminal (−) of the amplifier OP. One terminal of the sixth switch SW6 is coupled to the output terminal of the amplifier OP, and another terminal of the sixth switch SW6 is coupled to the second converting module 30.

The measuring module 24 comprises a Precision Measure Unit (PMU) 241, a pattern generating unit 243 and a micro processor 245. The precision measure unit 241 receives the signal measuring result RESULT and measures the resistance of the first resistor R1. The pattern generating unit 243 is coupled to the first converting module 26 for generating the testing signal $S_T$ according to a control signal $S_C$. The micro processor 245 is coupled to the precision measure unit 241 and the pattern generating unit 243 for generating the control signal $S_C$ and determining the capacitance CV of the capacitor C according to the signal measuring result RESULT. According to an embodiment of the present invention, the pattern generating unit 243 includes a pattern generator. The micro processor 245 within the measuring module 24 determines capacitance of the capacitor C according to resistance of the first resistor R1 and the signal measuring result RESULT. The micro processor 245 generates at least one switch control signal (not shown) for controlling the first switch SW1, the second switch SW2, the third switch SW3, the fourth switch SW4, the fifth switch SW5 and the sixth switch SW6 so as to enable the amplifier OP to generate the amplified signal $S_{AMP}$.

The first converting module 26 may be a digital to analog converter for converting the testing signal $S_T$ in a digital mode into the testing input signal $S_{IN}$ in an analog mode. The second converting module 30 may be a root mean square direct current converter (RMS-DC Converter) for converting the amplified signal $S_{AMP}$ into the signal measuring result RESULT, wherein the signal measuring result RESULT is a DC voltage value.

The procedure for testing the capacitance CV of the device under test 22 by using the circuit testing apparatus 20 is described in the following. Firstly, the micro processor 245 generates switch control signals (not shown) for controlling the first switch SW1, the second switch SW2 and the sixth switch SW6 to be turned on, and controlling the rest of switches to be turned off. Thus, the obtained measurement result from the precision measure unit 241 is as follows:

$$\text{Gain } A = |R2/R1| \qquad \text{Eq. (1)}.$$

That is, Gain A is equal to the absolute value of the resistance of the second resistor R2 divided by the resistance of the first resistor R1.

Next, the micro processor 245 controls the third switch SW3, the fourth switch SW4 and the sixth switch SW6 to be turned on, and controls the rest of switches to be turned off. Thus, the obtained measurement result becomes as follows:

$$\text{Gain } B = |R2/Xc| \qquad \text{Eq. (2)},$$

where $Xc=1/2\pi*f*CV$, and Xc is capacitive reactance of the capacitor C, $\pi=3.1416\ldots$, f is the signal frequency, and CV is the capacitance of the capacitor C.

For measurement of the gain with both effect of resistors R1 and reactance Xc, the micro processor 245 controls the first switch SW1, the second switch SW2, the third switch SW3, the fourth switch SW4 and the sixth switch SW6 to be turned on, and the fifth switch SW5 to be turned off. Thus, the obtained measurement result is:

$$\text{Gain } C = |R2/Xc//R1| = R2/[(Xc*R1)/(Xc+R1)] = [R2*(Xc+R1)]/(Xc*R1) \qquad \text{Eq. (3)},$$

wherein, when using Eq. (1) and Eq. (2) for substitution, the following can be derived:

$$\text{Gain } C = \text{Gain } A * [(Xc + R1)/Xc], \text{ and} \qquad \text{Eq. (4)}$$

$$= \text{Gain } B * [(Xc + R1)/R1]. \qquad \text{Eq. (5)}$$

Since Eq. (4) equals to Eq. (5), the following can be obtained:

$$\text{Gain } A*[(Xc+R1)/Xc]=\text{Gain } B*[(Xc+R1)/R1],$$

$$\text{Gain } B/\text{Gain } A=[(Xc+R1)/Xc]/[(Xc+R1)/R1], \text{ and}$$

$$\text{Gain } B/\text{Gain } A=R1/Xc.$$

Meanwhile, since the resistance of the resistor R1 the gain values Gain A and Gain B may be obtained through the precision measure unit 241, the following can be obtained:

$$Xc*\text{Gain } B=R1*\text{Gain } A,$$

$$Xc=(R1*\text{Gain } A)/\text{Gain } B,$$

$$1/2\pi*f*CV=(R1*\text{Gain } A)/\text{Gain } B, \text{ and}$$

$$2\pi*f*CV=\text{Gain } B/(R1*\text{Gain } A).$$

It is known that $2\pi=2*3.1416\ldots$, and the frequency f may be determined through the testing signal $S_T$ of the pattern generating unit 243 which is also a known value. Thus, the capacitance CV can be obtained as follows:

$$CV = [\text{Gain } B/(R1*\text{Gain } A)]/2\pi*f \qquad \text{Eq. (6)}$$

$$= \text{Gain } B/(2\pi*f*R1*\text{Gain } A).$$

If we can obtain the precise value of resistor R1, Gain A, Gain B and the frequency f, the capacitance CV may be obtained according to Eq. (6).

In addition, the circuit testing apparatus may further comprise a register coupled to the micro processor for storing the signal measuring result.

According to the embodiments of the invention, the circuit testing apparatus performs the digital/analog signal conversion via the first converting module and the second converting module, and further performs the measurement of the capacitance of the capacitor within the device under test via the processing module. In this manner, the capacitance may be tested via the digital logic testing machine, which overcomes the limitation of using only the dedicated testing apparatus in the conventional design. Compared to the requirement of using only the dedicated testing apparatus in the conventional design, capacitance measurement may be achieved by using the digital logic testing machine according to the embodiment of the invention. It should be noted that the testing cost is greatly reduced and convenience is also increased, which are both advantageous when compared to the conventional design.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A circuit testing apparatus for testing capacitance of a capacitor of a device under test, comprising:
   a measuring module for outputting a testing signal, and determining said capacitance of said capacitor according to a signal measuring result of said testing signal;
   a first converting module coupled to said measuring module for receiving and converting said testing signal to generate a testing input signal;
   a processing module coupled to said first converting module and said device under test for receiving and transmitting said testing input signal to said capacitor, and amplifying an output signal generated by said capacitor to generate an amplified signal; and
   a second converting module coupled to said processing module and said measuring module for converting said amplified signal to generate said signal measuring result,
   wherein said processing module comprises:
   a first switch with a terminal coupled to said first converting module;
   a second switch;
   a first resistor with a terminal coupled to said first switch, and another terminal of said first resistor coupled to said second switch;
   a third switch with a terminal coupled to said first converting module and another terminal of said third switch coupled to a terminal of said capacitor;
   a fourth switch with a terminal coupled to another terminal of said capacitor;
   an amplifier having a non-negative input terminal, a negative input terminal and an output terminal, wherein said negative input terminal is coupled to another terminal of said second switch and another terminal of said fourth switch, and said non-negative input terminal is coupled to a ground, and wherein said amplifier amplifies said output signal to generate said amplified signal;
   a fifth switch with a terminal coupled to said first converting module and another terminal of said fifth switch coupled to said output terminal of said amplifier;
   a second resistor coupled between said output terminal and said negative input terminal of said amplifier; and
   a sixth switch with a terminal coupled to said output terminal of said amplifier and another terminal of said sixth switch coupled to said second converting module.

2. The circuit testing apparatus as claimed in claim 1, wherein said measuring module comprises:
   a precision measure unit for receiving said signal measuring result;
   a pattern generating unit coupled to said first converting module for generating said testing signal according to a control signal; and
   a micro processor coupled to said precision measure unit and said pattern generating unit for generating said control signal and determining said capacitance of said capacitor according to said signal measuring result.

3. The circuit testing apparatus as claimed in claim 2, wherein said pattern generating unit includes a pattern generator.

4. The circuit testing apparatus as claimed in claim 2, wherein said micro processor generates at least one switch control signal for controlling said first switch, said second switch, said third switch, said fourth switch, said fifth switch and said sixth switch so as to enable said amplifier to generate said amplified signal.

5. The circuit testing apparatus as claimed in claim 2, further comprising a register coupled to said micro processor for storing said signal measuring result.

6. The circuit testing apparatus as claimed in claim 1, wherein said first converting module includes a digital to analog converter for converting said testing signal in a digital mode into said testing input signal in an analog mode.

7. The circuit testing apparatus as claimed in claim 1, wherein said second converting module includes a root mean square direct current converter (RMS-DC Converter) for converting said amplified signal into said signal measuring result, and wherein said signal measuring result is a DC voltage value.

8. The circuit testing apparatus as claimed in claim 1, wherein said measuring module measures resistance of said first resistor, and determines said capacitance according to said resistance of said first resistor and said signal measuring result.

9. The circuit testing apparatus as claimed in claim 1, wherein said device under test includes an integrated circuit.

10. The circuit testing apparatus as claimed in claim 1, wherein said measuring module is disposed in a logic testing machine.

* * * * *